(12) United States Patent
Choo et al.

(10) Patent No.: US 6,670,708 B2
(45) Date of Patent: Dec. 30, 2003

(54) THIN FILM TRANSISTOR ARRAY PANEL AND METHOD FOR FABRICATING THE SAME

(75) Inventors: Kyo Seop Choo, Seoul (KR); June Ho Park, Masan-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/028,982

(22) Filed: Dec. 28, 2001

(65) Prior Publication Data

US 2002/0121666 A1 Sep. 5, 2002

(30) Foreign Application Priority Data

Dec. 29, 2000 (KR) .......................................... 2000-85562

(51) Int. Cl.[7] .......................... H01L 23/48; H01L 23/52; H01L 29/40
(52) U.S. Cl. .......................... 257/739; 257/59; 257/72; 257/350
(58) Field of Search ............................. 257/59, 72, 350, 257/739

(56) References Cited

U.S. PATENT DOCUMENTS

| | | | | | |
|---|---|---|---|---|---|
| 5,608,248 | A | * | 3/1997 | Ohno | 257/306 |
| 6,005,290 | A | * | 12/1999 | Akram et al. | 257/723 |
| 6,023,089 | A | * | 2/2000 | Kang | 257/347 |

* cited by examiner

Primary Examiner—Ngân V. Ngô
(74) Attorney, Agent, or Firm—McKenna Long & Aldridge LLP

(57) ABSTRACT

A TFT array panel and a method for fabricating the same is disclosed, wherein an adhesion force between an elongated wire and a TFT array panel pad is improved by increasing the contact area of a bonding pad. The TFT array panel pad includes a first conductive layer formed in a pad region on an insulating substrate. The first conductive layer includes a plurality of conductive islands and holes. A second conductive layer is formed over and covers the first conductive layer.

20 Claims, 6 Drawing Sheets

THIN FILM TRANSISTOR ARRAY PANEL AND METHOD FOR FABRICATING THE SAME

This application claims the benefit of the Korean Application No. P2000-085562 filed on Dec. 29, 2000, which is hereby incorporated by reference as if fully set forth herein.

BACKGROUND OF THE INVENTION

1. Field of the Invention

The present invention relates to an array panel, and more particularly, to a thin film transistor array panel pad and a method for fabricating the same that is suitable for use in a digital X-ray detector (DXD).

2. Discussion of the Related Art

Since the X-ray was first discovered in 1895, the medical image field has depended on film as a medium for detecting X-rays. However, film requires development, physical storage, and complicated transmission, all of which take time and money. However, recently developed digital techniques have increasingly replaced film. One of the biggest differences between film and the recently developed digital techniques is the use of digital X-ray devices for obtaining images. The obtained image can be digitized and stored in a computer that provides for subsequent information analysis. Improved image quality, more precise measurements, and improved diagnosis can result form digitized images because various image processing techniques can be used to improve contrast ratios and boundary definitions.

A digital X-ray image apparatus ideally maximizes image sensitivity such that excellent picture quality is obtained using less X-ray radiation than with film. This enables a reduction in the X-ray radiation that is applied to a body. Because an image does not have to be developed on film, the equipment and chemicals necessary or X-ray film development is not required, thereby benefiting the environment. Because a computerized X-ray image can improve obtaining, managing, storing, transmitting, and displaying X-ray images, improved treatments can result.

A digital X-ray detector (DXD) converts an X-ray image into binary data that a computer can recognize. Thus, a digital X-ray image detector is an important part of a digital X-ray system. Generally, a digital X-ray detector includes a thin film transistor (TFT) array panel; an amorphous selenium layer deposited on the TFT array panel; and a transparent electrode formed on the amorphous selenium layer. In operation, X-rays irradiate the amorphous selenium layer, creating electron-hole pairs. The electron-hole pairs are separated and accelerated by a voltage applied across the transparent electrode and another electrode. Electrons are captured at an outer electrode, while holes are captured at an electrode disposed above the TFT. By selectively switching charges captured on the disposed electrodes to electronic networks an X-ray image can be obtained by proper signal processing.

The present invention relates to a DXD TFT array panel, and more particularly to a bonding pad that electrically connects a driving integrated circuit (IC) to a TFT array panel. Generally, the thicker the metal layer of a bonding pad is, the better the contacting force. However, there is a practical limit to the thickness of a bonding pad.

A contact pad of a related art TFT array panel will be explained with reference to the accompanying drawings. FIGS. 1 and 2 are structural sectional views of pads of related art TFT array panels. As shown, a pad of the related art TFT array panel can be comprised of a single metal layer $102a$ on an insulating substrate 101; or comprised of a first conductive layer $102b$ and a second conductive layer 103, which is formed by depositing gate or data wire materials on the first conductive layer $102b$.

However, related art TFT array panels have problems. With a single metal layer pad, reference FIG. 1, the thickness of the metal layer $102a$ must be 4000 Å (angstroms) or more. However, when depositing metal with such a thickness a significant amount of stress is generated. That stress can result in a hillock being formed, which can lead to electrical shorting. The hillock problem can be reduced by pads having first and second conductive layers $102b$ and 103, reference FIG. 2. That is, a first metal layer $102b$ can be deposited and patterned, then a second layer 103 can complete the pad. Even though two layer pads can improve the bonding force with bonding wires, the bonding wire contact area still has a practical limit.

Therefore, a bonding pad having improved bonding force with a wire would be beneficial. Even more beneficial would be a TFT panel having greater contact areas between pads and bonding wires.

SUMMARY OF THE INVENTION

Accordingly, the present invention is directed to a thin film transistor (TFT) array panel and to a method for fabricating the same that substantially obviates one or more problems due to limitations and disadvantages of the related art.

An advantage of the present invention is a TFT array panel and a method for fabricating the same that can increase a contact area between a pad and a bonding wire.

Additional advantages and features of the invention will be set forth in part in the description which follows and in part will become apparent to those having ordinary skill in the art upon examination of the following or may be learned from practice of the invention.

The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a thin film transistor (TFT) array panel defined by an active region and a pad region includes on an insulating substrate a first conductive layer having a plurality of conductive islands and holes. The first conductive layer is in the pad region. A second conductive layer covers the first conductive layer. The second conductive layer extends into the active region and forms a three-dimensionally patterned structure due to the contours of the first conductive layer.

Beneficially, the first conductive layer and the second conductive layer are formed of an aluminum neodymium (AlNd) alloy.

The second conductive layer beneficially extends into an array wire.

Beneficially, the holes and conductive islands form a matrix.

The holes and conductive islands can be circular or tetrahedral. The holes and conductive islands specifically can have rectangular or square cross-sections. The holes and conductive islands can be elongated perpendicular to or parallel with an array wire. The holes and conductive islands beneficially are organized in a matrix. Such matrices can be comprised of holes and/or conductive islands arranged in rows and columns such that all rows and all columns have the same number of holes and/or conductive islands, or different numbers of holes and/or conductive islands. Rows can be spatially offset (with not all rows necessarily having the same number of holes and/or conductive islands), and columns can be spatially offset (with not all columns necessarily having the same number of holes and/or conductive islands).

A method for fabricating the TFT array panel defined by an active region and a pad region includes the steps of: forming a first conductive layer having a plurality of holes and conductive islands in the pad region and on an insulating substrate, and then forming a second conductive layer over the first conductive layer and in the active region such that the first conductive layer is covered.

Accordingly, since the first conductive layer is patterned (beneficially with a constant interval) the second conductive layer has a concave-convex structure, thereby increasing the contact surface area over the related art doubled layer structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to illustrated embodiments of the present invention, examples of which are shown in the accompanying drawings. Wherever possible, the same reference numbers will be used throughout the drawings to refer to the same or like parts.

Figure 1:
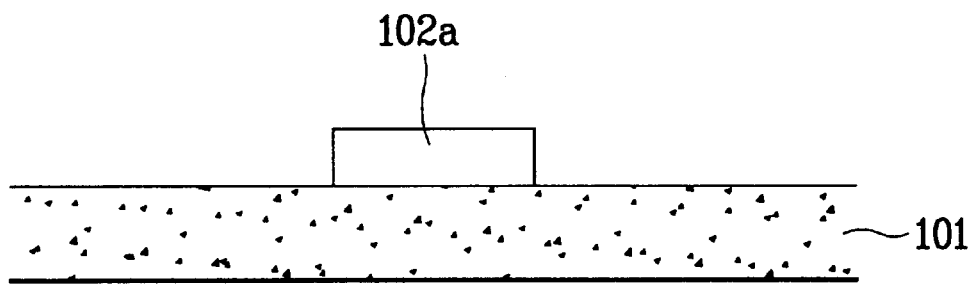
FIG. 1 illustrates a structural sectional view of a pad of a related art TFT array panel.
Figure 2:
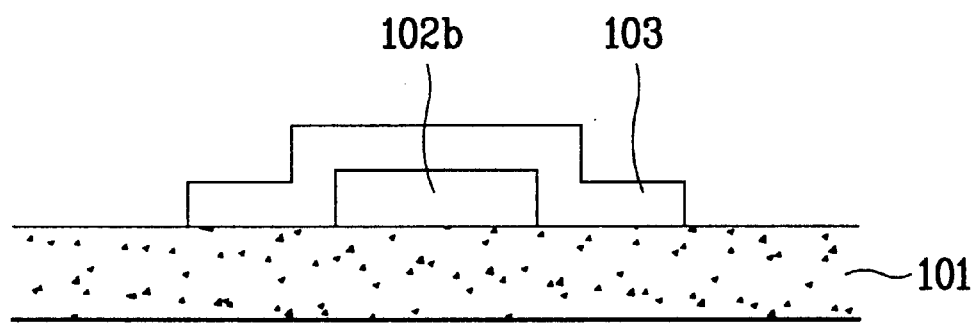
FIG. 2 illustrates a structural sectional view of a pad according to another related art TFT array panel.
Figure 3:
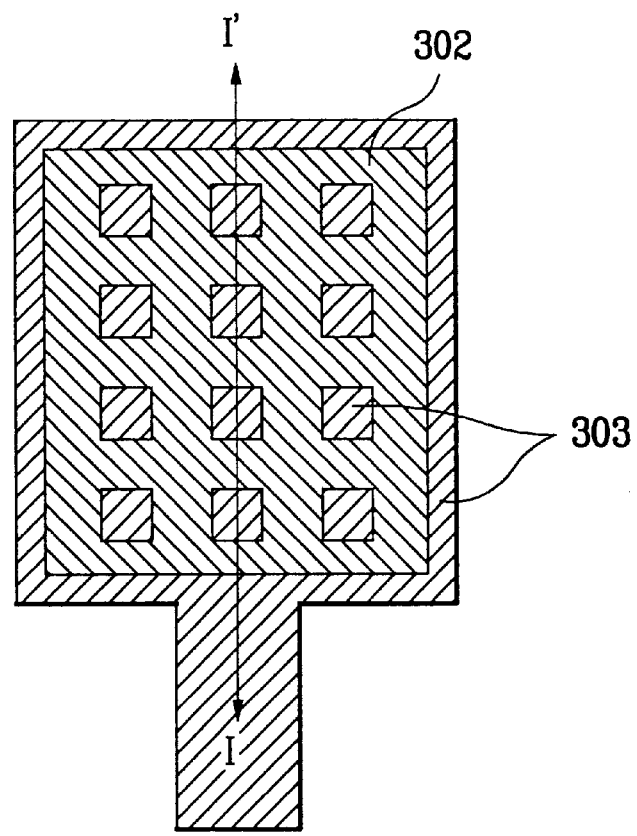
FIG. 3 illustrates a structural plan view of a pad of a TFT array panel according to a first embodiment of the present invention.
Figure 4:
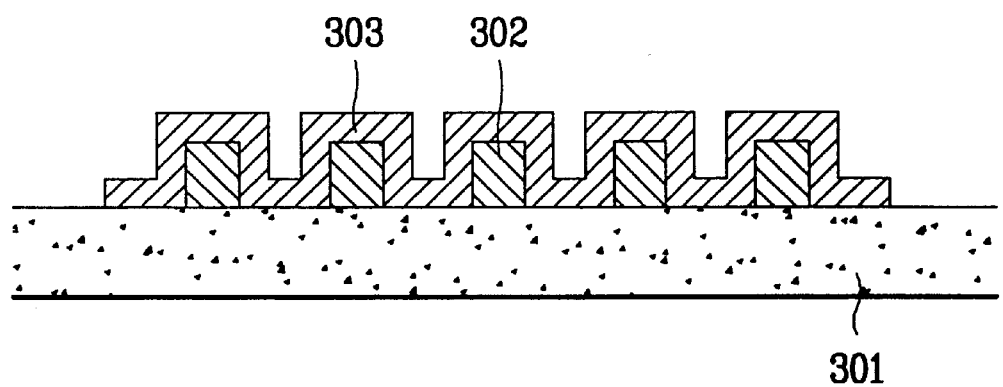
FIG. 4 illustrates a structural sectional view taken along line I–I' of FIG. 3.

FIG. 3 illustrates a structural plan view of a pad of a thin film transistor (TFT) array panel according to a first embodiment of the present invention; while FIG. 4 illustrates a structural sectional view taken along line I–I' of FIG. 3.

As shown in FIGS. 3 and 4, a pad of a TFT array panel according to a first embodiment of the present invention includes a first conductive layer 302 that is formed on an insulating substrate 301 in a pad region. The first conductive layer 302 is comprised of conductive islands and holes (reference FIG. 5A) that are distributed over the pad region. The conductive islands and holes can take numerous forms, including polyhedrons and cylinders. Beneficially, the conductive islands and holes are spaced at regular intervals. A second conductive layer 303 that extends into an array wire conductor covers the first conductive layer 302. The second conductive layer 303 forms a concave-convex structure due to the contours of the holes and conductive islands of the first conductive layer.

Herein, the first conductive layer 302 and the second conductive layer 303 are beneficially formed of an aluminum neodymium alloy.

A method for fabricating the pad of a TFT array panel shown in FIGS. 3 and 4 will be explained with reference to FIGS. 5A and 5B, which illustrate sectional views when forming that pad.

Figure 5A:
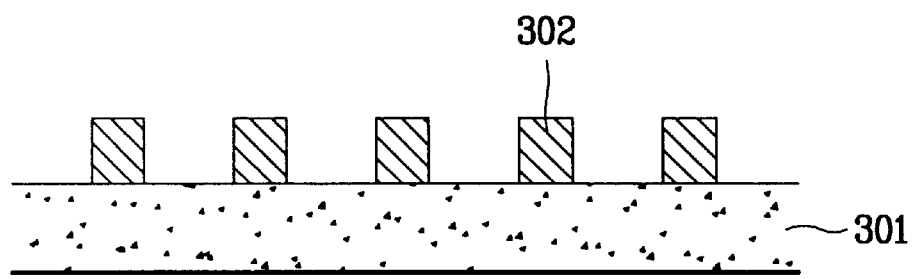
FIGS. 5A and 5B illustrate sectional views showing a method for fabricating pads of a TFT array panel according to the present invention.

As shown in FIG. 5A, a conductive material (an aluminum neodymium alloy) is deposited on the insulating substrate 301 by sputtering. The deposited conductive material is then patterned using a photolithographic-based etching process to form the first conductive layer 302 with conductive islands and holes, beneficially at regular intervals, in the pad region. Beneficially, the first conductive layer 302 forms about half of the maximum thickness of the complete pad. Also, even though the conductive islands and holes are shown in the Figures (reference FIG. 5A through FIG. 11) as regular tetrahedrons, other shapes, specifically including circles, are also possible.

Figure 5B:
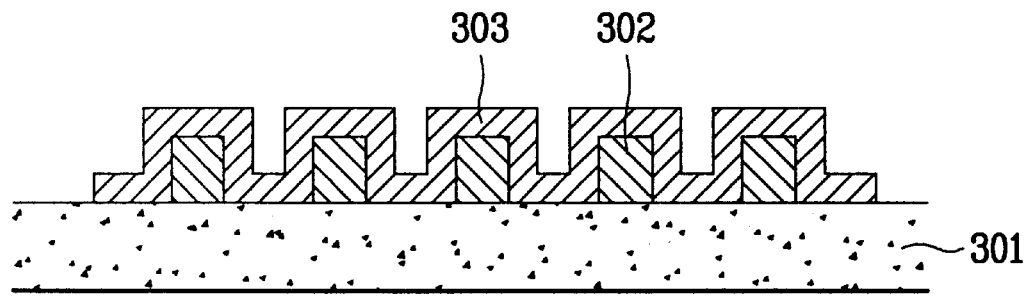

Then, as shown in FIG. 5B, a conductive material (aluminum neodymium) is deposited on the pad area by sputtering so as to cover the first conductive layer 302. That deposited conductive material is then patterned to form the second conductive layer 303 that extends into an elongated array wire. This completes a pad according to an embodiment of the present invention.

The second conductive layer 303 has a concave-convex structure because of the contours of the conductive islands and holes that form the first conductive layer 302.

The thickness of a completed pad according to the present invention is beneficially approximately 5000 Å, with that thickness being the sum of the first conductive layer 302 and the second conductive layer 303.

Figure 6:
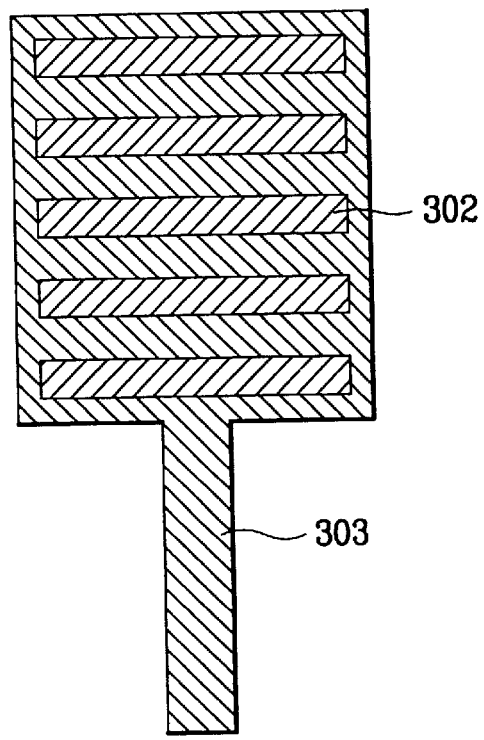
FIG. 6 illustrates a structural plan view of a pad of a TFT array panel according to a second embodiment of the present invention.
Figure 7:
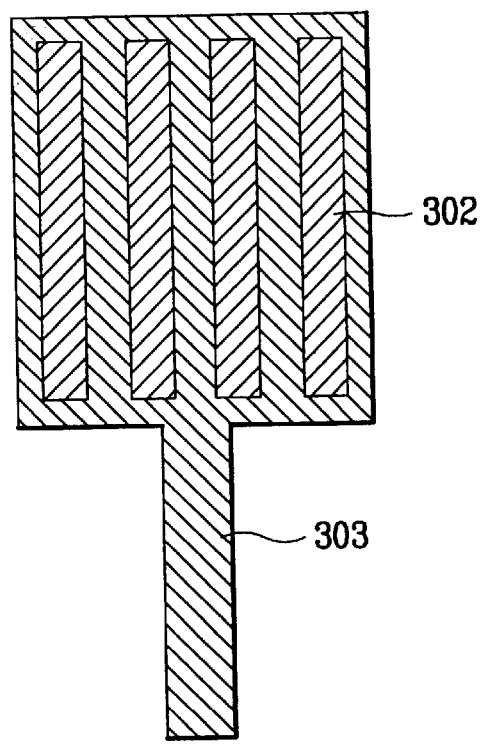
FIG. 7 illustrates a structural plan view of a pad of a TFT array panel according to a third embodiment of the present invention.
Figure 8:
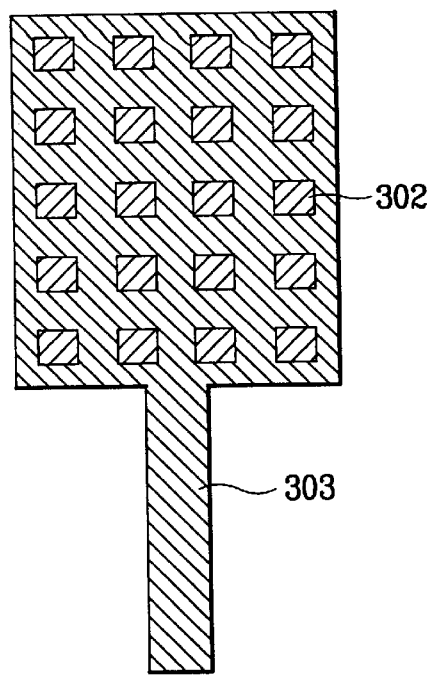
FIG. 8 illustrates a structural plan view of a pad of a TFT array panel according to a fourth embodiment of the present invention.
Figure 9:
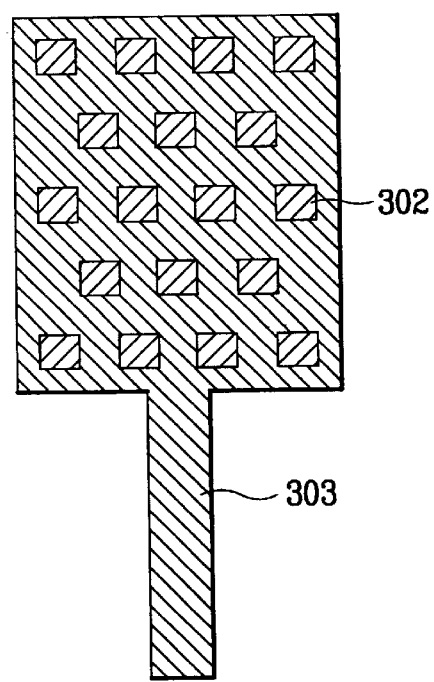
FIG. 9 illustrates a structural plan view of a pad of a TFT array panel according to a fifth embodiment of the present invention.
Figure 10:
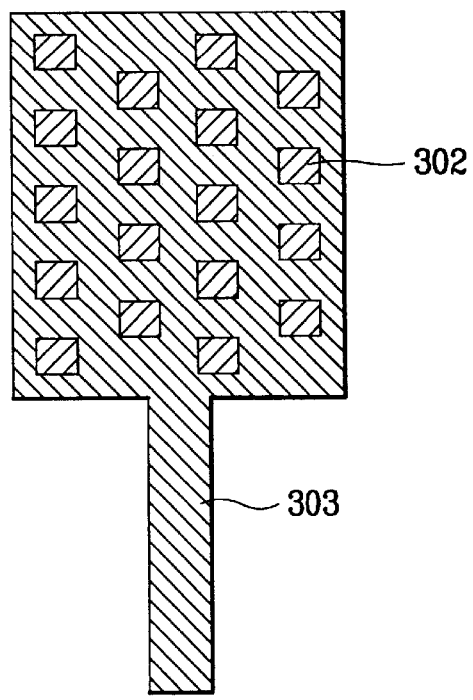
FIG. 10 illustrates a structural plan view of a pad of a TFT array panel according to a sixth embodiment of the present invention.
Figure 11:
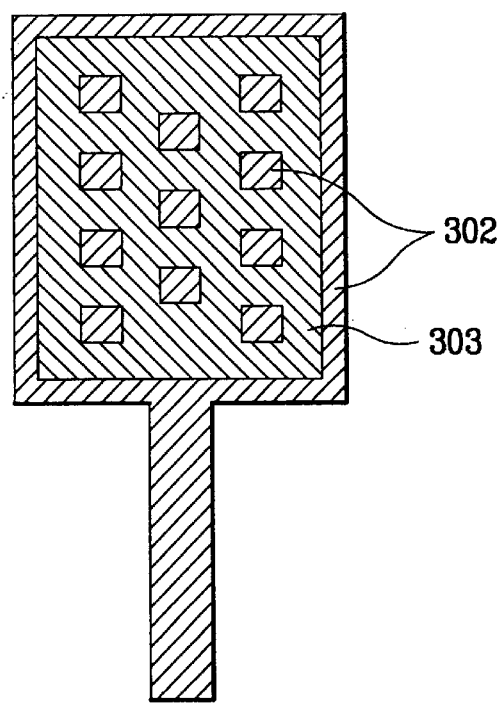
FIG. 11 illustrates a structural plan view of a pad of a TFT array panel according to a seventh embodiment of the present invention.

A structure of a pad of a TFT array panel according to the present invention is not limited to any particular island or hole pattern. FIGS. 6 through and 11 illustrate a number of other possibilities. FIG. 6 illustrates a structural plan view of a pad of a TFT array panel according to a second embodiment of the present invention; FIG. 7 illustrates a structural plan view of a pad of a TFT array panel according to a third embodiment of the present invention; FIG. 8 illustrates a structural plan view of a pad of a TFT array panel according to a fourth embodiment of the present invention, FIG. 9 illustrates a structural plan view of a pad of a TFT array panel according to a fifth embodiment of the present invention; FIG. 10 illustrates a structural plan view of a pad of a TFT array panel according to a sixth embodiment of the present invention; and FIG. 11 illustrates a structural plan view of a pad of a TFT array panel according to a seventh embodiment of the present invention.

As shown in FIG. 6, the second embodiment pad of a TFT array panel has a first conductive layer 302 that is formed into a plurality of rectangular shaped islands and holes that extend perpendicular to an extend portion of the second conductive layer 303. The second conductive layer 303 is beneficially comprised of the same material as the first conductive layer 302, and is formed over and covers the first conductive layer 302.

As shown in FIG. 7, the third embodiment pad has a first conductive layer 302 that is formed into a plurality of rectangular shaped islands and holes that extend parallel to an extend portion of the second conductive layer 303. The second conductive layer 303 is beneficially comprised of the same material as the first conductive layer 302, and is formed over and covers the first conductive layer 302.

As shown in FIG. 8, the fourth embodiment of the present invention has a first conductive layer 302 that is arranged as a plurality of islands (and holes) that are formed in a matrix of rows and columns. As shown in FIG. 8, the rows and columns are regularly spaced. The second conductive layer 303 is beneficially comprised of the same material as the first conductive layer 302, and is formed over and covers the first conductive layer 302.

However, it is not required that the island and hole matrix be so regular. As shown in FIG. 9 the matrix island and hole rows can be offset from adjacent rows. Furthermore, as shown in FIG. 9 not all rows and not all columns need have the same number of islands and holes. Referring now to FIG. 10, it is also permissible under the principles of the present invention to offset columns. Finally, as shown in FIG. 11 it is also permissible under the principles of the present invention to have the first conductive layer 302 formed into conductive islands as well as into an extended array line. Then, the second conductive layer 303 can electrically connect the conductive islands with the extended array line.

A pad of a TFT array panel and a method for fabricating the same according to the present invention have the following advantages.

That is, since the pad metal layer has a concave-convex three-dimensional structure, a contact area between the bonding extended array line and the pad is increased, thereby improving adhesion.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A TFT array panel, comprising:
a first conductive layer having a plurality of holes and located on an insulating substrate in a pad region; and
a second conductive layer covering the first conductive layer and located in an active region.

2. The TFT array panel as claimed in claim 1, wherein the first and second conductive layers are formed of aluminum neodymium (AlNd).

3. The TFT array panel as claimed in claim 1, wherein the second conductive layer extends into an array wire.

4. The TFT array panel as claimed in claim 1, wherein the holes of said plurality of holes form a matrix.

5. The TFT array panel as claimed in claim 1, wherein at least one hole of said plurality of holes is shaped as a tetragon.

6. The TFT array panel as claimed in claim 1, wherein at least one hole of said plurality of holes is circular.

7. A thin film transistor array panel pad, comprising:
a first conductive layer on an insulating substrate, the first conductive layer having a plurality of conductive islands in a pad region; and
a second conductive layer covering the first conductive layer and extending into an active region;
wherein the combination of the first conductive layer and the second conductive layer form a concave-convex three-dimensional pattern.

8. The thin film transistor array panel as claimed in claim 7, wherein the first conductive layer and the second conductive layer are aluminum neodymium (AlNd).

9. The thin film transistor array panel as claimed in claim 7, wherein the second conductive layer extends to form an array wire.

10. The thin film transistor array panel as claimed in claim 7, wherein the conductive islands of said plurality of conductive islands form a matrix.

11. The thin film transistor array panel as claimed in claim 7, wherein at least one conductive island of said plurality of conductive islands is tetrahedral.

12. The thin film transistor array panel as claimed in claim 7, wherein at least one conductive island of said plurality of conductive islands is circular.

13. A thin film transistor array panel pad, comprising:
a first conductive layer having a plurality of island shaped conductors in a pad region and on an insulating substrate; and
a second conductive layer above the first conductive layer so as to cover the first conductive layer.

14. The thin film transistor array panel as claimed in claim 13, wherein the first and second conductive layers are of aluminum neodymium (AlNd) alloy.

15. The thin film transistor array panel as claimed in claim 13, wherein the second conductive layer extends to form an array wire.

16. The thin film transistor array panel as claimed in claim 13, wherein the plurality of island shaped conductors forms a matrix.

17. The thin film transistor array panel as claimed in claim 13, wherein each island shaped conductor of said plurality of island shaped conductors is substantially tetrahedral.

18. The thin film transistor array panel as claimed in claim 13, wherein each island shaped conductor of said plurality of island shaped conductors is substantially circular.

19. The thin film transistor array panel as claimed in claim 13, wherein three island shaped conductors of said plurality of island shaped conductors align along a diagonal line.

20. The thin film transistor array panel as claimed in claim 13, wherein the first conductive layer is electrically in contact with the second conductive layer.

* * * * *